United States Patent [19]

Zahir et al.

[11] 4,131,707

[45] Dec. 26, 1978

[54] STABLE RESIN SOLUTIONS CONTAINING COMPOUNDS HAVING AT LEAST ONE FURYL RADICAL

[75] Inventors: Abdul-Cader Zahir, Oberwil; Sigfried Wyler, Dornach, both of Switzerland

[73] Assignee: Ciba-Geigy Corporation, Ardsley, N.Y.

[21] Appl. No.: 739,877

[22] Filed: Nov. 8, 1976

[30] Foreign Application Priority Data

Nov. 14, 1975 [CH] Switzerland .................. 14797/75

[51] Int. Cl.$^2$ ...................... B32B 7/00; B05D 3/02
[52] U.S. Cl. .................................. 428/251; 156/288; 427/96; 427/379; 427/388 A; 427/390 A; 427/390 R; 427/409; 428/267; 428/268; 428/273; 428/287; 428/435; 428/458; 526/258; 526/263; 526/303
[58] Field of Search ............... 156/288; 260/47 UA; 526/258, 263, 303, 11.1; 427/96, 379, 388 A, 390 A, 390 R, 409; 428/267, 268, 273, 251, 287, 435, 458

[56] References Cited

U.S. PATENT DOCUMENTS

| 3,435,003 | 3/1969 | Craven ............................ 260/47 |
| 3,576,691 | 4/1971 | Meyers ........................... 428/458 |
| 3,582,458 | 6/1971 | Haller ............................. 428/458 |
| 3,700,538 | 10/1972 | Kennedy ........................ 428/458 |
| 3,778,411 | 12/1973 | Emerick et al. ................ 428/458 |
| 3,822,175 | 7/1974 | Yuan .............................. 428/251 |
| 3,887,582 | 6/1975 | Holub et al. ................... 526/263 |
| 3,898,363 | 8/1975 | Ward et al. .................... 428/458 |
| 3,930,097 | 12/1975 | Alberino et al. .............. 428/273 |

FOREIGN PATENT DOCUMENTS

1555564 12/1968 France.

*Primary Examiner*—William R. Dixon, Jr.
*Attorney, Agent, or Firm*—Vincent J. Cavalieri

[57] ABSTRACT

The invention relates to solutions which are stable on storage and which contain curable mixtures of polymaleimides, comonomers for these polymaleimides and, optionally, polymerization catalysts and compounds which contain at least one furyl radical, preferably furfuryl alcohol. The solutions are used for the manufacture of crosslinked polymers containing imide groups. Usually a substrate is impregnated with the solution. After drying, curing is carried out at 100 to 300° C. Using a known method, for example, glass fibre fabric is subjected to hot pressing together with a copper foil, curing being effected. This gives correspondingly copper-coated laminated sheets which are outstandingly suitable for the manufacture of printed circuits.

14 Claims, No Drawings

STABLE RESIN SOLUTIONS CONTAINING COMPOUNDS HAVING AT LEAST ONE FURYL RADICAL

The invention relates to solutions which are stable on storage and which contain curable mixtures of polymaleimides and comonomers and the use of these solutions for the manufacture of crosslinked polyimides and for firm adhesive bonding of metals to substrates.

Today it is in the main epoxide resins and, for elements where the technical requirements are less exacting, also phenol-formaldehyde resins which are employed as the synthetic resin for the manufacture of copper-coated laminate sheets, which are employed in particular for printed circuits. A particular criterion for the quality of the copper-coated sheet is the adhesive strength between the copper foil and the laminated sheet. For conventional sheets based on an epoxide resin, the limiting specification is 3.6 kp/in according to NEMA Standard LI 1-1971 (US Standard Specification of the "National Electrical Manufacturers Association").

Copper-coated laminates based on polymerised polymaleimides have also already been manufactured. For the manufacture of the sheets, the glass fabric was first impregnated with a melt or a solution of the curable maleimide and, optionally, the comonomers and polymerisation catalysts or the prepolymers and the material thus obtained was then subjected, in several layers one on top of the other, to hot pressing with the copper foil. In this context, mention should be made, for example, of the following publication: "Polyimide laminating resin for multi-layer printed wiring boards" Insulation/Circuits, October 1974, 25–29.

Compared with the conventional copper-coated laminate sheets based on an epoxide resin, those based on a polymaleimide resin display great advantages. This is because they are more resistant to heat and have a considerably greater dimensional stability. However, copper-coated laminate sheets of this type which are based on a polymaleimide resin have hitherto not yet found any great acceptance in the electrical industry because the adhesion between the copper and the laminate sheets did not meet the requirements. The adhesive strength of these known sheets, in which the surface of the copper foils has been modified according to a known brass treatment, is between 1.5 and 2.4 kp/in.

In Russian Pat. No. 345,156, a process for the manufacture of adducts of furfuryl alcohol with aromatic dimaleimides is claimed. It is difficult to precondense the precipitated adducts with other comonomers to give prepolymers, so that usable impregnating solutions cannot be obtained. As experiments have shown, it is not possible to obtain adequately strong adhesive bonds with copper by the use of the adducts claimed by the SU patent for the manufacture of copper-coated laminates.

Industry makes the high demands in respect of the adhesion for the following reasons: flawless punching, bending and soldering and controlled, clean etching are possible only in the case of outstanding adhesion between the copper foil and the laminate sheet. Loosening of the copper foil from the sheet (especially as a result of the heat during soldering) inevitably leads to the thin conductors of the sheet shifting or "floating off". This makes it impossible to manufacture printed circuit boards which serve to carry electronic components.

A further reason why polyimide laminates of this type have not found any great acceptance industrially hitherto is the fact that the corresponding impregnating solutions are the cause of difficulties during processing. This is because the resulting storage stability of the impregnating solution is very poor in this case also when the customary solvents, such as methylglycol, dimethylformamide, N-methylpyrrolidone, acetone and methyl ethyl ketone, are used. At room temperature the viscosity already doubles in the course of one to three days. Apart from this, the polymaleimides or the prepolymers crystallise out in many cases even after short storage.

In the light of the existing state of the art, it was a matter of particular concern to the electrical industry and their suppliers to provide impregnating solutions which are based on a polymaleimide and are stable on storage, the use of which makes it possible to manufacture copper-coated laminate sheets in which the adhesive strength between the copper foil and the base sheet is adequately high. The problem thus posed has been solved by the invention in a simple and elegant manner.

The invention relates to solutions which are stable on storage and contain curable mixtures of 1.) imides or amidecarboxylic acids which contain in the molecule one or several, and preferably at least two, radicals of the general formulae I or II

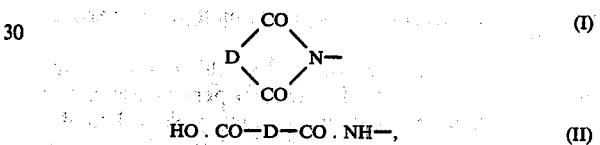

$$HO . CO—D—CO . NH—, \quad (II)$$

in which D denotes a divalent radical containing a carbon-carbon double bond, 2.) comonomers for the imides or amidecarboxylic acids and, optionally, 3.) polymerisation catalysts, which solutions are characterised in that they additionally contain one or several compounds which contain at least one furyl radical per molecule in an amount such that there are 0.05 to 10, and preferably 0.1 to 5, equivalents of this compound which contains a furyl radical in the molecule per 1 equivalent of imide or amidecarboxylic acid.

Since it has hitherto not been possible, when manufacturing copper-coated laminate plates, to achieve adhesion of the copper which meets the industrial requirements either by the use of solutions and melts of polymaleimides and comonomers, or of corresponding prepolymers, or by the use of furfuryl alcohol-maleimide adducts according to Russian Pat. No. 345,156, the elegant solution to the problem of the invention, which leads to outstanding adhesion of the copper, must be regarded as really surprising. It is also astonishing that virtually no difficulties due to inadequate storage stability, that is to say a rising viscosity and crystallising out after a short storage time, arise with the solutions according to the invention.

The solutions according to the invention are in most cases colloidal solutions which can be in the form of emulsions or of suspensions. In some cases, and in particular when the formation of the prepolymer is not very far advanced, the solutions can also be wholly or partially molecularly disperse (that is to say true) solutions.

According to the invention the concentration of all the solids, and of the starting substances which lead to the solids, in the solution, is between 5 and 90% by weight and preferably between 50 and 70% by weight, the % by weight data relating to the total solution.

In the solution according to the invention, the imides or the amidecarboxylic acids and the comonomers are in a ratio such that there are 0.1 to 1.5 equivalents of comonomer per one equivalent of imide of the formula I or of amidecarboxylic acid of the formula II.

Most of the imides and amidecarboxylic acids which can be employed according to the invention have been described in detail in the literature. They can be manufactured by the methods described in U.S. Pat. No. 3,522,271 and in British Patent Specification 1,137,592 by reacting the corresponding diamines with the unsaturated dicarboxylic acid anhydrides.

The solutions according to the invention can contain all the polyimides (and the corresponding polyamidecarboxylic acids) which have already been listed in French Pat. No. 1,555,564. Maleimides which contain the radical of the formula I, in which D denotes the divalent radical of the formula III

wherein R represents hydrogen or methyl, are particular suitable.

Solutions containing polyimides which contain two or three radicals of the formula (I) per molecule, and thus, in particular, solutions containing bis-maleimides and tris-maleimides, are a preferred form of the invention.

Particularly suitable bis-maleimides which may be mentioned are compounds of the formula IV

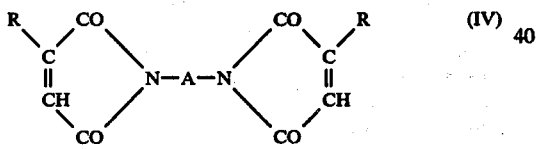

in which A denotes a divalent organic radical with 2 to 30 C atoms.

The radical A in formula IV preferably corresponds to the formula

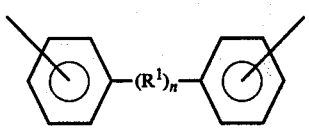

in which $R^1$ represents one of the radicals

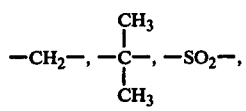

—SO—, —S— and —O— and n is 0 or 1.

The following substances may be mentioned as examples of known polyimides which are suitable for the solutions according to the invention: N,N'-hexamethylene-bis-maleimide, N,N'-p-phenylene-bis-maleimide, N,N'-4,4'-diphenylmethane-bis-maleimide, N,N'-4,4'-3,3'-dichloro-diphenylmethane-bis-maleimide, N,N'-4,4'-diphenyl ether-bis-maleimide, N,N'-4,4'-diphenyl-sulphone-bis-maleimide, the N,N'-bis-maleimide of 4,4'-diamino-triphenyl phosphate, the N,N'-bis-maleimide of 4,4'-diamino-triphenyl thiophosphate, the N,N',N'''-tris-maleimide of tris-4-aminophenyl phosphate and the N,N',N''-tris-maleimide of tris-4-aminophenyl thiophosphate.

It is also possible to use mixtures of two or more of all the abovementioned polyimides for the solutions according to the invention. According to the invention, it is, of course, also possible for the intermediate products of all the maleimides mentioned individually above, that is to say the maleimidecarboxylic acids which contain a radical of the formula II, to be used in the solutions.

The solutions according to the invention contain, as comonomers, the known reactants for bis-maleimides or mixtures thereof. The following substances may be listed: polyprimary amines, polyhydric phenols, polyhydric alcohols, polycarboxylic acids, alkenylphenols, alkenylphenol ethers and azomethines. Preferably, the solutions contain polyprimary amines, alkenylphenols or alkenylphenol ethers, azomethines or mixtures of several of these substances.

Suitable amines which are employed are aromatic or araliphatic diprimary or triprimary amines with 2 to 40 C. atoms per molecule. Diamines of the formula

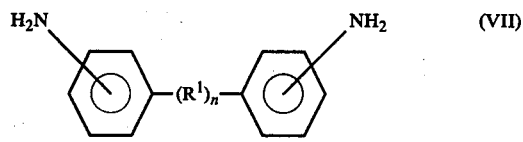

in which $R^1$ and n have the abovementioned meaning, are particularly suitable. In principle, all the polyamines which have already been listed in French Pat. No. 1,555,564 can also be employed. The following polyamines may be mentioned individually as examples: triaminobenzene, melamine, tetraaminodiphenylmethane, 1,4-diamino-cyclohexane, the phenylenediamines, 4,4'-diamino-diphenyl-methane, 4,4'-diamino-diphenyl ether, 4,4'-diaminodiphenylsulphone and 4,4'-diaminotriphenyl phosphate.

The alkenylphenols or alkenylphenol ethers which are employed are, in particular, allylphenols and methallylphenols, or the ethers thereof. Both mononuclear and polynuclear, preferably binuclear, alkenylphenols and alkenylphenol ethers can be employed. Preferably, at least one nucleus contains both an alkenyl group and a phenolic, optionally etherified, OH group.

As is known, alkenylphenols are manufactured by thermal rearrangement (Claisen) of the alkenyl ethers of phenols (for example of the allyl ether of phenol). These alkenyl ethers are also obtained according to known processes by reacting phenols and, for example, allyl chloride in the presence of an alkali metal hydroxide and solvents. As is known, a condensation reaction (elimination of the alkali metal chloride) takes place.

A typical binuclear alkenylphenol which can be employed according to the invention is in alkenylphenol of the formula VIII

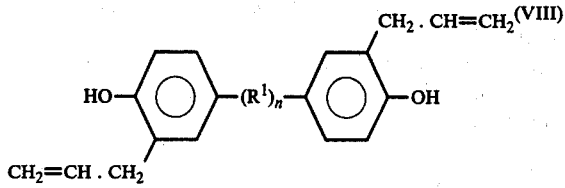

in which $R^1$ and n have the above meaning.

According to the invention, the use of mixtures of polynuclear alkenylphenols and/or alkenylphenol ethers with mononuclear alkenylphenols and/or alkenylphenol ethers also gives good results. Alkenylphenol ethers which are preferably employed are those substances which contain one or several molecular radicals of the formula IX $$-O-R^2 \quad (IX)$$

in which $R^2$ denotes an alkyl radical with 1 to 10 C atoms, an aryl radical or an alkenyl radical, preferably allyl or methallyl, and the O atom in formula IX represents the phenolic ether bridge.

A further embodiment of the invention is the use of mixtures of those substances which contain only one OH group and only one alkenyl group on the aromatic nucleus with substances which contain several OH groups and/or several alkenyl groups on the aromatic nucleus, or of mixtures of the corresponding phenol ethers of these substances.

The following substances may be listed as examples of alkenylphenols which can be employed for the solutions according to the invention: o,o'-diallyl-bisphenol A, 4,4'-hydroxy-3,3'-allyl-diphenyl, bis-(4-hydroxy-3-allyl-phenyl)-methane, 2,2-bis-(4-hydroxy-3,5-diallyl-phenyl)-propane and eugenol.

The corresponding methallyl compounds can also be used. In place of the alkenylphenols mentioned, it is also possible to employ the corresponding ethers of these phenols, especially the methyl ethers.

The azomethines contained in the solutions according to the invention are, in particular, those of the general formulae

or

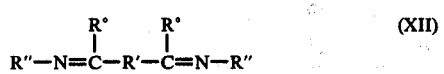

in which R° denotes a hydrogen atom, a linear or branched aliphatic hydrocarbon radical with up to 12 carbon atoms, a cycloaliphatic or cycloaliphatic-aliphatic hydrocarbon radical with up to 12 carbon atoms, an aromatic radical with 6–12 carbon atoms, an araliphatic hydrocarbon radical with up to 20 carbon atoms or a heterocyclic or heterocyclic-aliphatic radical, R' and R" have the same meanings as R° except for the meaning of a hydrogen atom, it being possible for R' together with R°, with the inclusion of the C atom which carries the two substituents, also to denote a cycloaliphatic ring system, and E denotes a divalent organic radical with at least 2 and at most 30 carbon atoms.

Specific azomethines which may be mentioned are: 1,6-benzylidenehexamethylenediamine, N,N'-benzylidene-p-phenylenediamine, N,N'-benzylidenediaminodiphenylmethane, benzylidenebutylamine and benzalaniline.

Polyhydric phenols, polyhydric alcohols and polycarboxylic acids which can be contained in the solutions according to the invention are all the known phenols, alcohols and carboxylic acids which are generally used for the manufacture of plastics (phenolic resins, epoxide resins, polyesters and polyamides). It is therefore not necessary to discuss these comonomers for the maleimides in more detail here.

Polymerisation catalysts which can be contained in the solutions according to the invention are ionic and free radical catalysts. They should be present in the reaction mixture in a concentration of from 0.05 to 10% by weight and preferably of from 0.1 to 5% by weight, relative to the total amount of the reactants.

Amongst the ionic catalysts, those which are suitable according to the invention are especially tertiary, secondary and primary amines or amines which contain several amino groups of different types (for example mixed tertiary/secondary amines) and quaternary ammonium compounds. These amines catalysts can be both monoamines and polyamines. In a case where primary and secondary amines are used, monoamines are to be preferred. The following substances may be listed as examples of such amine catalysts: diethylamine, tributylamine, triethylamine, triamylamine, benzylamine, tetramethyldiaminodiphenylmethane, N,N-diisobutylaminoacetonitrile, N,N-dibutylaminoacetonitrile, heterocyclic bases, such as quinoline, N-methylpyrrolidone, imidazole and benzimidazole and their homologues, and also mercaptobenzthiazole. Examples of suitable quaternary ammonium compounds which may be mentioned are benzyltrimethylammonium hydroxide and benzyltrimethylammonium methoxide.

Further suitable ionic catalysts are alkali metal compounds, such as alkali metal alcoholates and alkali metal hydroxides. Sodium methylate is particularly suitable. Suitable free radical polymerisation catalysts are the known organic peroxides and hydroperoxides, as well as azoisobutyronitrile. In this case also, the preferred concentration is 0.1 to 5.0% by weight.

Further polymerisation catalysts which can be used for the solutions according to the invention are acetylacetonates, especially the acetyl-acetonates of the transition metals. The corresponding vanadium compound is to be singled out in particular. These particular polymerisation catalysts are also employed in the concentration already mentioned above.

The solutions according to the invention contain in the main organic solvents as the solvents. In principle, all organic solvents which are chemically inert with respect to the maleimides or maleimidecarboxylic acids and with respect to the comonomers are suitable. Of course, the solvents also must not adversely change any catalysts which may be contained in the solution. Organic solvents which are preferably used are acetone and methyl ethyl ketone. The use of water as a solvent, optionally mixed with organic solvents, is also included in the invention.

According to the invention, the compounds which contain at least one furyl radical per molecule can be solid or liquid substances. Liquids are preferably employed and there are then virtually constituents of the particular solvent in the solution. They can replace up to 0.5 to 100% by weight of the solvent; that is to say liquid substances of this type which contain at least one furyl radical can also be the sole solvent. This applies in particular to furfuryl alcohol which is preferably contained in the solutions according to the invention. If furfuryl alcohol is used on its own as the solvent, the abovementioned mandatory rule with regard to the chemical inertness towards the maleimides and the maleimidecarboxylic acids exceptionally no longer applies in this case.

The most simple of the compounds which contain at least one furyl radical per molecule can be characterised by the formula XIII

and furane is also to be included under this. The radical R in this formula can have, say, the following meanings:

field, curing is effected, after the evaporation of the solvent, by heating to 100° to 300° C. for about 1 to 5 hours. During curing the crosslinked polymers containing imide groups are formed. The use of the solutions for the manufacture of such polymers is also a subject of this invention.

If a firm adhesive bond between metals and substrates is to be obtained according to the invention, the procedure is such that the substrate and, optionally, the surface of the body made of metal, preferably of copper, is impregnated with a solution according to the invention and the polymers are then produced by pressing the two bodies together and by heating to 100° to 300° C.

The procedure is preferably that fibres, woven fabrics, non-wovens or the like, preferably made of glass, are impregnated, as the substrate, with the solution according to the invention and the resulting prepregs, stacked one on top of the other in several layers, are then subjected to hot pressing with the copper foil. However, fibres, woven fabrics and fibre fleeces made of mineral substances (quartz, rock wool, asbestos and the like), boron, carbon and heat-resistant plastics can also be employed as the substrate. In principle, it is possible to glue a metal foil onto both the top and the

--- a) $-CHO$ b) $-\underset{OH}{\overset{\phantom{|}}{CH}}-Y$   (Y = H or an aromatic radical)

c) $-CH\begin{matrix}Y_1\\Y_2\end{matrix}$   ($Y_1$ and $Y_2$ = aromatic radicals)

d) $-CH_2OX$   ($X = -C_2H_5, -CH_2-\overset{O}{\overset{\diagdown}{CH}}-CH_2, -CO.CH_3,$
$-CO.CH=CH_2, -CO.\underset{CH_3}{\overset{\phantom{|}}{C}}=CH_2, -CO.CH=CH.CO-$ or $+CH_2-\phantom{xx}\overline{\phantom{xxx}}\phantom{xx}_n H$).

e) $-CH\begin{matrix}OZ_1\\OZ_2\end{matrix}$   ($Z_1$ and $Z_2$ = aliphatic radicals).

---

The compounds listed under b) and c) are mainly substances which can be prepared by an addition reaction of furfurol with phenols, especially with bisphenols or dialkylbisphenol.

As is demonstrated by the above explanation, compounds according to the invention which contain at least one furyl radical per molecule are also in general furfuryl derivatives.

The solutions according to the invention are mainly employed as impregnating solutions. In principle, however, it is also conceivable that they can be used for surface coating, that is to say in particular in the lacquer field. As impregnating solutions they are used, for example, for the manufacture of prepregs of all types, especially of chopped glass fibre prepregs for plastic moulding compositions. As impregnating solutions, they can also advantageously be employed in the filament winding process.

Both when the solutions are used as an impregnating solution and when they are employed in the lacquer bottom (that is to say to both sides) of the substrate.

With regard to the fibres, woven fabrics and fibre fleeces made of glass, which can be employed in these applications of the solutions according to the invention, it should also be mentioned that in general, in the present case those glass fibre substrates which have one of the finishes customary today also give the best products. As is known, these finishes are applied by surface treatment of the glass fibres with substances such as a methacrylate/chromium-III complex and vinyl-tri-(2-methoxyethoxy)-silane. The publication "Neue Glasgewebe-Finishs" ("New finishes for glass fabrics") by F. Hörsch in KUNSTSTOFFE 55 (1965) 909–912 should be mentioned in this context.

When copper sheets are processed, according to the invention, with glass fibre prepregs to give copper-coated laminate sheets, especially for printed circuits, electrolytic copper foils which have been modified by a layer of brass applied to the surface by means of electroplating are employed.

Copper-coated laminate sheets which consist of polymers containing imide groups and of glass fibre substrates and in which the adhesive bond has been produced in accordance with the invention and which are characterised by adhesive strengths between the copper foil and the laminate sheet (according to NEMA LI 1-1971) of 3.0 to 5.0 are a further subject of the invention.

EXAMPLE 1

1.0 mol of N,N'-4,4'-diphenylmethane-bis-maleimide and 1.15 mols of diallylbisphenol A are melted at 120° C. A 50% strength solution is produced by adding furfuryl alcohol at a temperature of 120° C. The solution is cooled to room temperature. The viscosity is adjusted to 200 cP/25° C., that desired for impregnating, by adding a little furfuryl alcohol.

This solution is then used to impregnate a glass fabric which has a weight per m$^2$ of 280 g and a satin weave and which contains a chromium-III methacrylate complex of the formula

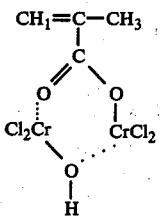

as the adhesion promoter. For this purpose, the glass fabric is impregnated by the dipping process at 25° C. and then dried in a circulating air drying cabinet for 8 minutes at 180° C. 14 layers of the impregnated fabric are then pressed between two 35 micron thick copper foils, the surface of which has been pre-treated by electroplating with brass.

The press is first kept under a light contact pressure for 2 minutes and the pressure is then increased to 30 kp/cm$^2$. The preliminary reaction in the drying cabinet can be avoided by a correspondingly longer contact time in the press.

The test piece is taken from the press after one hour and is post-cured in an oven at 240° C. for a further 6 hours. A tough, heat-resistant laminate of high mechanical quality is obtained.

EXAMPLE 2

1.0 mol of N,N'-4,4'-diphenylmethane-bis-maleimide, 1.0 mol of diallylbisphenol A and 2.0 mols of furfuryl alcohol are brought into solution at 120° C. The solution is subjected to a preliminary reaction for 4 hours at 120° C. and is then diluted with 705 parts of methylglycol and cooled to room temperature. The impregnating solution, which is now ready for use, is used to produce copper-coated laminate sheets, the procedure employed being exactly the same as that in Example 1.

EXAMPLE 3

1.0 mol of N,N'-4,4'-diphenylmethane-bis-maleimide and 0.4 mol of diaminodiphenylmethane are diluted, at 80° C., by means of furfuryl alcohol to give a 30% strength impregnating solution. The impregnating solution produced in this way is used to manufacture copper-coated laminate sheets. The procedure employed is as in Example 1, but drying and preliminary condensation is carried out for 20 minutes in the circulating air drying cabinet.

EXAMPLE 4

1.0 mol of N,N'-4,4'-diphenylmethane-bis-maleimide is dissolved at 80° C. in 500 g of furfuryl alcohol and the solution is cooled to 25° C. 0.4 mol of diaminodiphenylmethane are dissolved at 25° C. in 200 g of methylglycol. The two solutions are combined and mixed well and used, in accordance with Example 3, for the manufacture of copper-coated laminate sheets.

EXAMPLE 5

1.3 mols of N,N'-4,4'-diphenylmethane-bis-maleimide, 0.4 mol of diaminodiphenylmethane and 0.3 mol of the bis-azomethine of N,N'-benzylidene-diaminodiphenylmethane are processed, using furfuryl alcohol, to give a 55% strength solution. The solution is heated to 110° C. for 4 hours and then cooled. The manufacture of copper-coated sheets using this solution is carried out completely analgously to the process described in Example 3.

EXAMPLE 6 (comparison example)

1.0 mol of N,N'-4,4'-diphenylmethane-bis-maleimide and 1.15 mols of diallylbisphenol A are melted at 120° C. Without further additions of solvent, the melt is used to impregnate a glass fabric such as is used in Example 1. For this purpose the glass fabric is impregnated by the dipping process at 180° C. The resulting impregnated fabric web is then dried for 9 minutes in a circulating air drying cabinet at a temperature of 180° C. in order to achieve favourable flow properties during subsequent pressing. Coating with copper foils with simultaneous production of the laminate sheets is carried out in precisely the same way as described in Example 1.

EXAMPLE 7 (comparison example)

1.0 mol of N,N'-4,4'-diphenylmethane-bis-maleimide and 1.15 mols of diallylbisphenol A are melted at 120° C. in a reaction vessel. The melt is subjected to preliminary reaction for 4 hours at 120° C. The pre-reacted product is dissolved at 120° C. in an amount of methylglycol such that the solution has a viscosity of 200 cP at 25° C. This solution is used for the manufacture of copper-coated laminate sheets and the procedure employed is in accordance with the method described in Example 1.

EXAMPLE 8 (comparison example)

1.0 mol of N,N'-4,4'-diphenylmethane-bis-maleimide and 0.4 mol of diaminodiphenylmethane are diluted at 25° C. using N-methyl-pyrrolidone to give a 50% strength impregnating solution.

This solution is used to manufacture copper-coated laminate sheets and the procedure employed is in accordance with the method described in Example 1.

EXAMPLE 9 (comparison example)

1.0 mol of N,N'-4,4'-diphenylmethane-bis-maleimide and 0.4 mol of diaminodiphenylmethane are diluted at 80° C. using methylglycol to give a 50% strength impregnating solution. The resulting solution is used in accordance with the process described in Example 1 for impregnating glass fabrics. In the present example, however, the dryng time is 15 minutes. The further processing to give copper-coated sheets is also carried out in accordance with Example 1.

EXAMPLE 10 (comparison example)

1.3 mols of N,N'-4,4'-diphenylmethane-bis-maleimide, 0.4 mol of diaminodiphenylmethane and 0.3 mol of the bis-azomethine of N,N'-benzylidene-diaminodiphenylmethane are processed, using methylglycol, to give a 55% strength solution. The solution is heated to 110° C. for 4 hours and is then cooled. The manufacture of copper-coated sheets using this solution is carried out completely analogously to the process described in Example 3.

EXAMPLE 11 (comparison example)

N,N'-Diphenylmethane-bis-maleimide is dissolved in furfuryl alcohol in an amount such that a 30% strength solution is obtained. Impregnation is then carried out as in the preceding examples and the impregnated fabric is laminated with copper sheets.

Measurement of the storage stability of the impregnating solutions described in the examples and of the properties of the copper-coated laminate sheets Storage stability In each case the time taken for the viscosity of the impregnating solution to double at 25° C. and at 40° C. is determined.

Flexural strength in kp/mm²

The determination is carried out in accordance with ISO/R 178.

Adhesion of the copper

Measured at 25° C. and at 150° C. in accordance with NEMA LI 1-1971.

Absorption of water in % by weight after 24 hours at 23° C. and after 6 hours at 100° C. The measurements are carried out on bending test pieces according to VSM Standard 77,103. (VSM is the abbreviation for the Verein Schweizerischer Maschinenindustrieller (Association of Swiss Machinery Manufacturers)).

Dielectric loss factor (tan δ/50 Hz) measured at 23° C.; in accordance with DIN 53,483.

Dielectric constant (ε/50 Hz) measured at 23° C.; in accordance with DIN 53,483.

The measurement results are summarised in the table. The values clearly show that the adhesion of the copper reaches or exceeds 3 kp/in in all cases in which the impregnating solution according to the invention is employed. At the same time it can be seen that the storage stability of these solutions is adequately high.

Example 11 shows that the use of impregnating solutions which contain only a bis-maleimide but no comonomer does not lead to good adhesion of the copper, even when furfuryl alcohol is used as the solvent.

Table

| Example | 8 | 9 | 3* | 4* | 6 | 2* | 7 | 1* | 5* | 10 | 11 |
|---|---|---|---|---|---|---|---|---|---|---|---|
| Resin formulation | BI(2Equ.) DADP(0.8Equ.) | | | | BI(2Equ.) DALL(2.3Equ.) | | | | BI DADP BD | (2.4Equ. (0.8Equ.) (0.6Equ.) | BI |
| Solvent used | NMP | MG | FFA | 70% FFA 30% MG | melt | 30%FFA 70% MG | MG | FFA | FFA | MG | FFA |
| Viscosity doubled | | | | | | | | | | | |
| (days) at 25° C | 12 | <1 | >30 | >6 | — | 200 | 2 | 233 | >70 | 3 | >120 |
| (days) at 40° C | — | — | >10 | >6 | — | — | — | — | 30 | — | >20 |
| Flexural strength (kp/mm²) | 49.8 | 41.0 | 57.6 | 62.8 | 34.9 | 53.0 | 42.5 | 51.5 | — | 51.1 | 37.3 |
| Adhesion of the copper (kp/in) | | | | | | | | | | | |
| at 25° C | 1.9 | 2.6 | 3.4 | 3.4 | 1.95 | 3.0 | 2.3 | 3.2 | — | 2.0 | 2.2 |
| at 150° C | 1.4 | 2.7 | 3.6 | 3.3 | 1.45 | 3.6 | 1.9 | 3.1 | — | 2.4 | 2.4 |
| Absorption of water (% by weight) | | | | | | | | | | | |
| 24 hours/23° C | 0.18 | 0.28 | 0.33 | 0.30 | 0.19 | 0.24 | 0.24 | 0.14 | — | 0.27 | 1.02 |
| 6 hours/100° C | 0.38 | 0.32 | 0.44 | 0.38 | 0.44 | 0.37 | 0.33 | 0.37 | — | 0.56 | 1.53 |
| Dielectric loss factor tan δ.10² (50Hz) 23° C | 0.55 | 0.55 | 0.38 | 0.49 | 0.42 | 0.36 | 0.57 | 0.42 | — | 0.39 | 0.44 |
| Dielectric constant δ | 5.3 | 5.1 | 5.4 | 5.5 | 4.3 | 4.9 | 4.7 | 5.1 | — | 4.9 | 5.0 |

Legend
*according to the invention
NMP N-Methylpyrrolidone
MG Methylglycol
FFA Furfuryl alcohol
THF Tetrahydrofurfuryl alcohol
BI Bis-maleimide
DADP Diaminodiphenylmethane
DALL Diallylbisphenol A
BD N,N'-Benzylidene-diaminodiphenylmethane

What is claimed is:

1. In a solution which contains a curable mixture of (1) imide or amide-carboxylic acid which contains in the molecule at least one of the radicals of the formulae

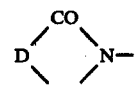 (I)

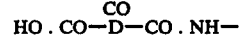 (II)

in which D denotes a divalent radical containing a carbon-carbon double bond, (2) comonomers of said imide or amide-carboxylic acid selected from the group consisting of polyprimary amine, polyhydric phenol, polyhydric alcohol, poly carboxylic acid, alkenylphenol, alkenylphenol ether, and an azo methine, or a mixture of these substances and, optionally, (3) ionic or free-radical polymerization catalysts, the improvement which comprises adding to said solution a compound which contains at least one furyl radical in an amount such that there are 0.05 to 10 equivalent of said compound per 1 equivalent of imide or amide-carboxylic acid.

2. A solution according to claim 1, which contains the imides or the amidecarboxylic acids and the comonomers in a ratio such that there are 0.1 to 1.5 equivalents of comonomer per 1 equivalent of imide of the formula I or of amidecarboxylic acid of the formula II.

3. A solution according to claim 1, which contains, as imides or amidecarboxylic acids of the formulae I and II respectively, maleimides or maleimidecarboxylic acids.

4. A solution according to claim 1, wherein the curable mixture contains the imides or amidecarboxylic acids of the formulae I and II respectively and the comonomers wholly or partially in the form of prepolymers.

5. A solution according to claim 1 containing from 5% to 90% by weight of solids.

6. A solution according to claim 1 which contains a solvent.

7. A solution according to claim 6, wherein the compounds which contain at least one furyl radical in the molecule are liquid and make up 0.5 to 100% by weight of the solvent used.

8. A solution according to claim 6, wherein the solvent contains furfuryl alcohol as the compound which contains at least one furyl radical in the molecule.

9. A solution according to claim 6, which contains only organic solvents.

10. A method of coating for the manufacture of a crosslinked polymer containing imide groups, wherein a substrate, is impregnated or coated with a solution according to claim 1, the solvent is then evaporated and, finally, curing and crosslinking are carried out, at temperatures of between 100° and 300° C.

11. A method of coating wherein a substrate and, optionally, the surface of a body made of metal are impregnated or coated with a solution according to claim 1 and a firm adhesive bond is then produced between the two bodies by curing at temperatures of between 100° and 300° C., whilst pressing the substrate and the metal body together.

12. A method according to claim 11, wherein fibres, woven fabrics, or non-woven fabrics, are employed as the substrate and these are subjected, in the form of prepregs, stacked in several layers one on top of the other, to hot pressing with a metal foil.

13. A method according to claim 12, wherein the metal foil employed is an electrolytic copper foil which has been modified by a layer of brass applied to the surface by means of electroplating.

14. A copper-coated laminate sheet which consists of polymers containing imide groups and of glass fibre substrates and in which the adhesive bond has been produced in accordance with claim 12, wherein the adhesive strength between the copper foil and the laminate sheet in accordance with NEMA LI 1-1971 is from 3.0 to 5.0 kp/in.

* * * * *